(12) United States Patent
Toda

(10) Patent No.: US 6,265,918 B1
(45) Date of Patent: Jul. 24, 2001

(54) CLOCK SIGNAL PROCESSING CIRCUIT AND SEMICONDUCTOR DEVICE IN WHICH A CLOCK SIGNAL IS PROCESSED IN IMPROVED METHOD

(75) Inventor: Haruki Toda, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/389,748

(22) Filed: Sep. 7, 1999

Related U.S. Application Data

(63) Continuation of application No. 08/887,321, filed on Jul. 2, 1997, now Pat. No. 5,949,260.

(30) Foreign Application Priority Data

Jul. 8, 1996 (JP) .................................................. 8-177677

(51) Int. Cl.[7] ............................ H03L 7/06; H03K 5/13
(52) U.S. Cl. ..................................... 327/146; 327/161
(58) Field of Search ................................. 327/158, 159, 327/152, 153, 154, 155, 149, 147, 146, 141, 161

(56) References Cited

U.S. PATENT DOCUMENTS

| | | | |
|---|---|---|---|
| 4,795,985 | 1/1989 | Gailbreath | 327/158 |
| 4,847,870 | * 7/1989 | Butcher | 375/87 |
| 5,036,297 | 7/1991 | Nakamura | 331/17 |
| 5,079,519 | 1/1992 | Ashby | 327/43 |
| 5,101,117 | 3/1992 | Johnson | 327/149 |
| 5,811,998 | * 9/1998 | Lundberg et al. | 327/156 |
| 5,949,260 | 9/1999 | Toda | 327/169 |

FOREIGN PATENT DOCUMENTS

| | | |
|---|---|---|
| 8-180678 | 7/1996 | (JP) . |
| 8-180678A | 7/1996 | (JP) . |

* cited by examiner

*Primary Examiner*—My-Trang Nu Ton
(74) *Attorney, Agent, or Firm*—Banner & Witcoff, Ltd.

(57) ABSTRACT

A semiconductor device for inputting/outputting data in synchronism with a reference clock signal and an internal clock signal in each circuit. In this device, a variably delay section 104 delays a generated clock signal to output an internal clock signal, and a phase error-detecting section 107 detects a time difference between the internal clock signal and the reference clock signal, thereby controlling the delay amount of the variable delay section 104 to make the time difference substantially zero.

15 Claims, 7 Drawing Sheets

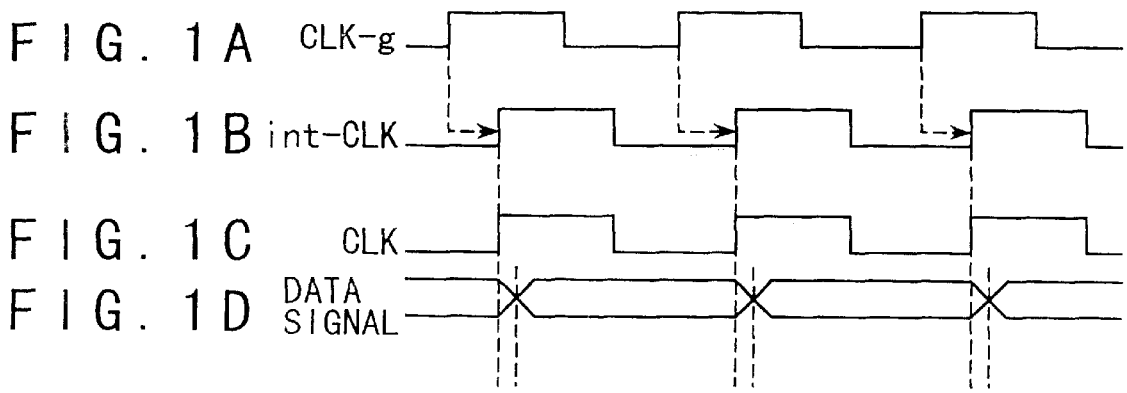
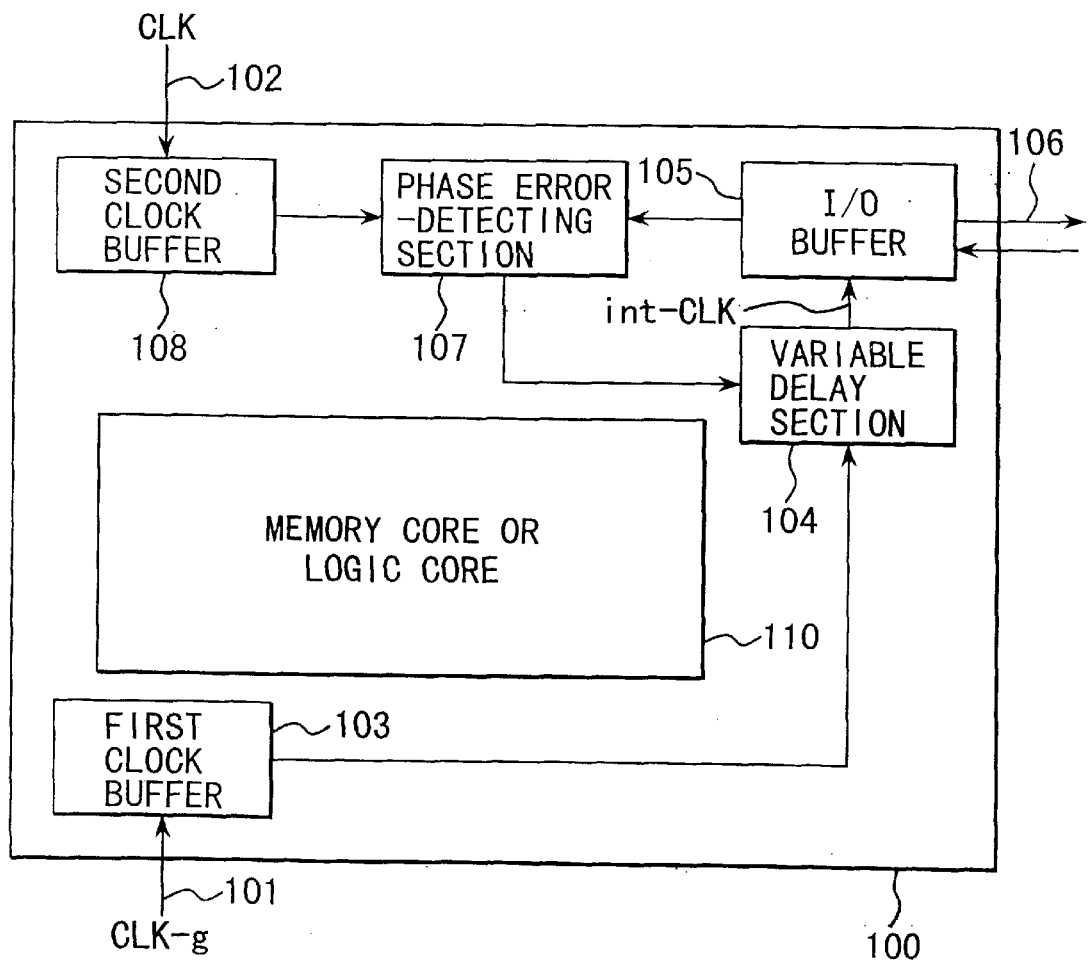
FIG. 2

FIG. 5A
FIG. 5B
FIG. 5C
FIG. 5D
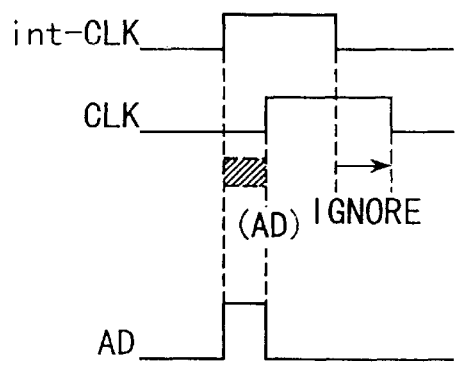
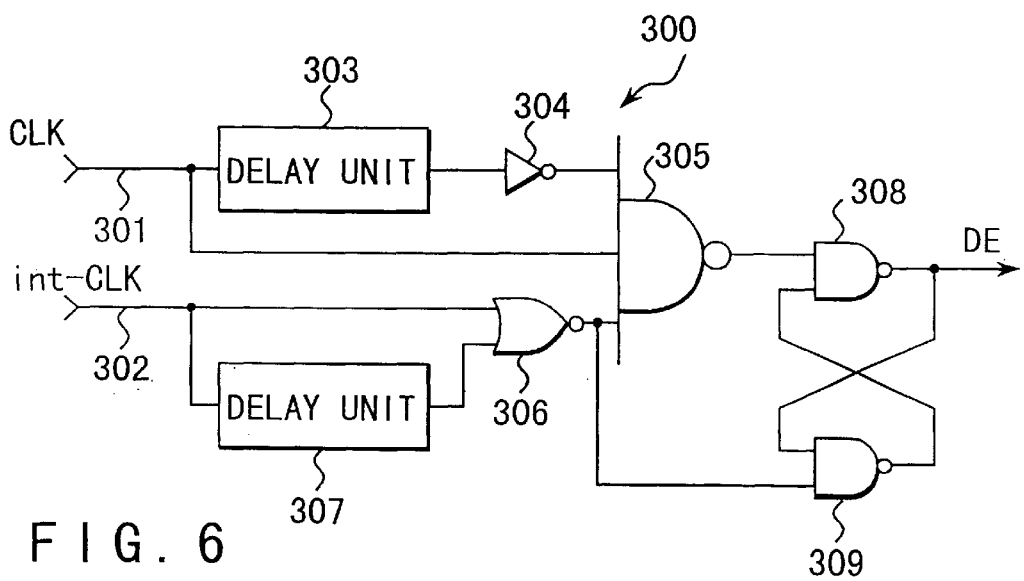
FIG. 6
FIG. 7A
FIG. 7B
FIG. 7C
FIG. 7D
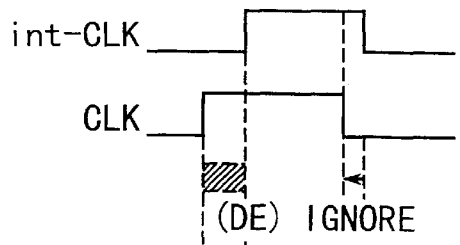
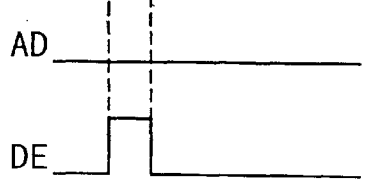

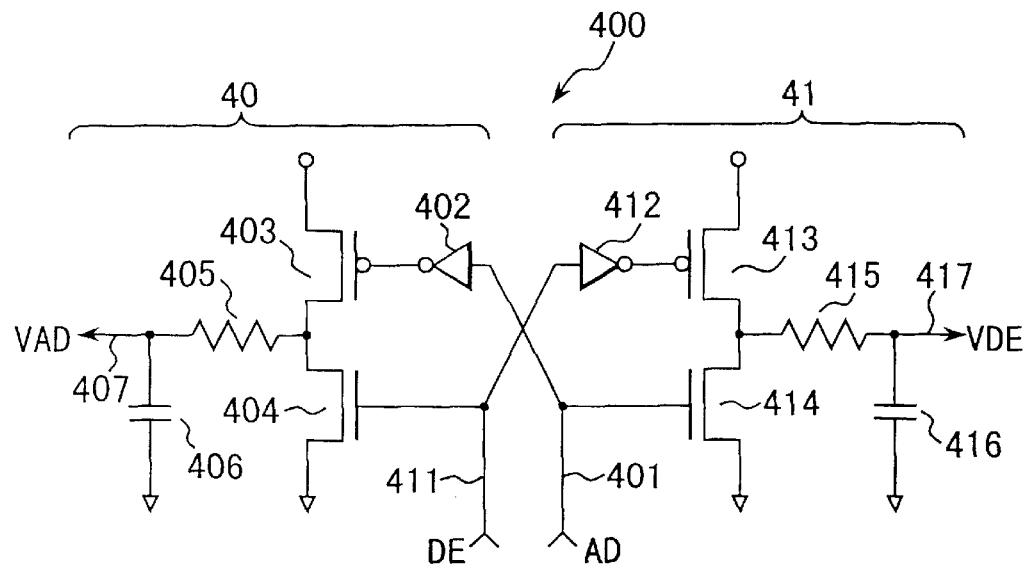
F I G. 8
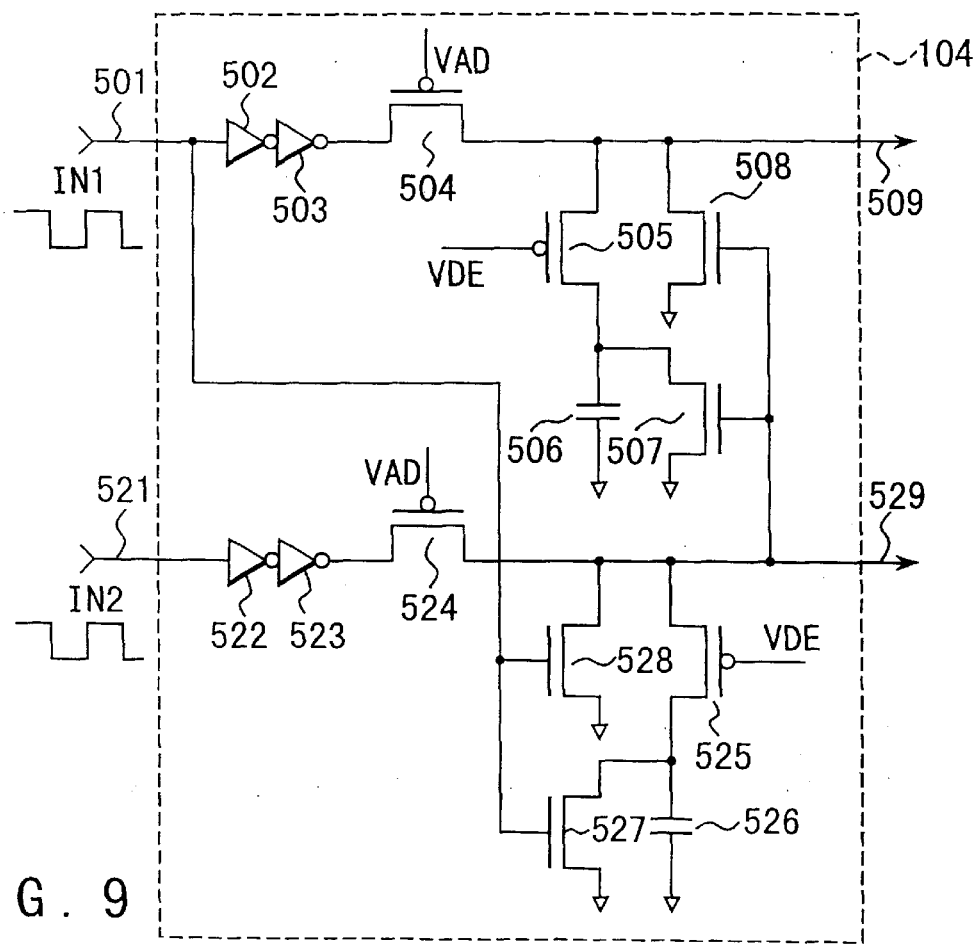
F I G. 9

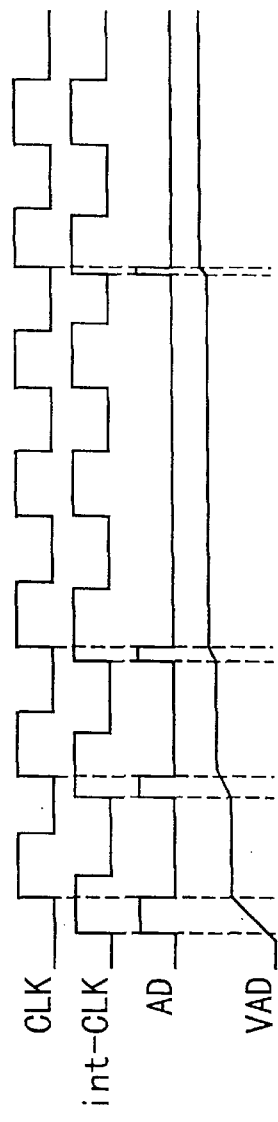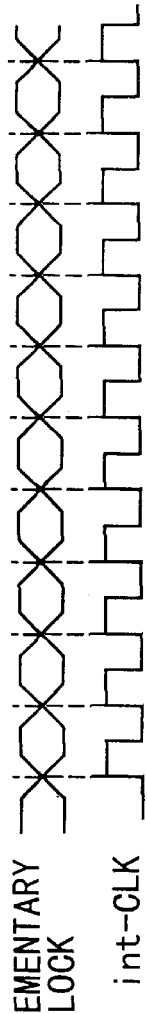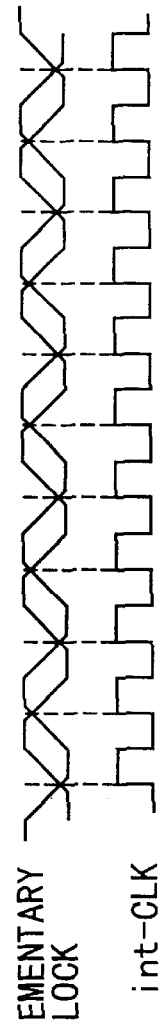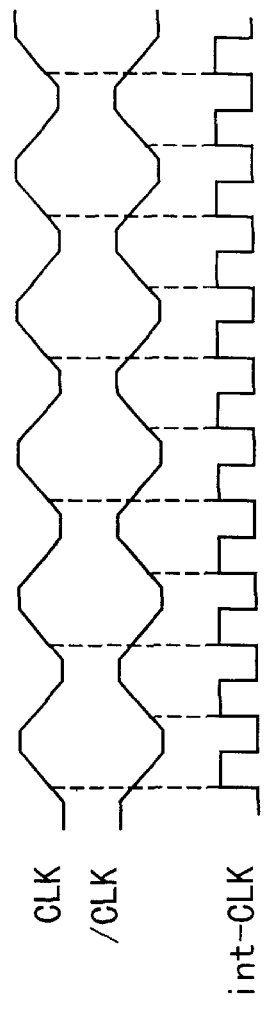
FIG. 13A CLK
FIG. 13B int-CLK
FIG. 13C AD
FIG. 13D VAD
FIG. 14A COMPLEMENTARY CLOCK
FIG. 14B int-CLK
FIG. 15A COMPLEMENTARY CLOCK
FIG. 15B int-CLK
FIG. 16A CLK
FIG. 16B /CLK
FIG. 16C int-CLK

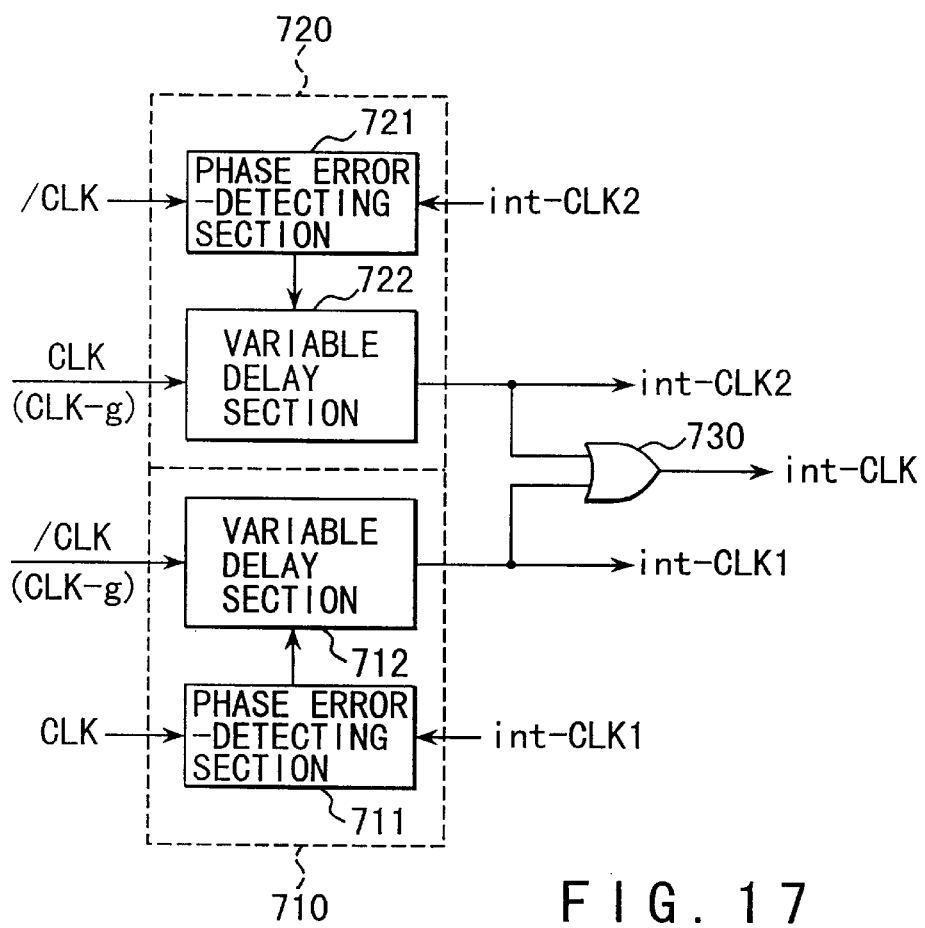
FIG. 17
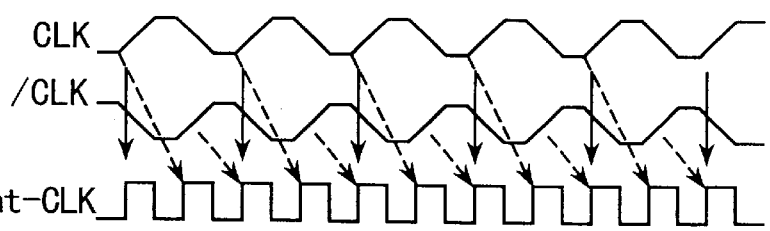
FIG. 18A CLK
FIG. 18B /CLK
FIG. 18C int-CLK
FIG. 18D int-CLK1
FIG. 18E int-CLK2

CLOCK SIGNAL PROCESSING CIRCUIT AND SEMICONDUCTOR DEVICE IN WHICH A CLOCK SIGNAL IS PROCESSED IN IMPROVED METHOD

This application is a continuation of prior application Ser. No. 08/887,321, filed Jul. 2, 1997, now U.S. Pat. No. 5,949,260.

BACKGROUND OF THE INVENTION

This invention relates to a semiconductor device for inputting and outputting a signal in synchronism with a high-speed clock signal, and more particularly, to a clock signal processing circuit and method and a semiconductor device wherein a clock signal is processed in an improved method, which are effectively used in a synchronous DRAM (Dynamic Random Access Memory).

With an increase in the operational speed of a MPU (Micro Processing Unit), an increase in the operational speed of a semiconductor memory is being required. In the case of the synchronous DRAM operable in synchronism with a clock signal, for example, data transfer at a high speed cycle of 100–200 MHz is needed.

Further, with an increase in memory capacity from 64 M-bits to 256 M-bits, the memory chip size is increased. Accordingly, when an external clock signal is taken and used as an internal clock signal, the internal clock signal may be delayed, depending upon which portion of the memory chip receives the signal.

BRIEF SUMMARY OF THE INVENTION

It is an object of the invention to provide a highly-reliable semiconductor device of a large size operable at high speed, which employs a clock signal free from a delay irrespective of a portion of a memory chip or a circuit position to which the distributed signal is applied.

To attain this object, there is provided a clock synchronizing circuit comprising: variable delay means for delaying a generated clock signal to create an internal clock signal; a detecting section for detecting a time difference between a predetermined phase of the internal clock signal and a predetermined phase of a reference clock signal; and delay amount control means for controlling a delay amount of the variable delay means to substantially eliminate the time difference, thereby substantially synchronizing the predetermined phase of the internal clock signal with the predetermined phase of the reference clock signal.

By virtue of the above structure, the phase of the internal clock signal is accurately synchronized with the phase of the reference clock signal. Further, the generated clock, which differs from the reference clock signal to be referred to for synchronization, is used to generate the internal clock signal to be synchronized with the reference clock signal. As a result, various types of signals can be used as the generated clock signal, which enables an accurately synchronized internal clock signal to be obtained using a simple structure.

BRIEF DESCRIPTION OF THE SEVERAL VIEWS OF THE DRAWING

FIGS. 1A–1D are views, showing a plurality of clock signals and a data signal useful in explaining the basic idea of the invention;

FIG. 2 is a schematic block diagram, showing a semiconductor device according to the invention;

FIGS. 5A–5D show signal waves useful in explaining the operation of the advance-detecting circuit of FIG. 4;

FIG. 6 is a view, showing an example of a delay-detecting circuit incorporated in the phase error-detecting section;

FIGS. 7A–7D show signal waves useful in explaining the operation of the delay-detecting circuit of FIG. 6;

FIG. 8 is a view, showing an example of a filter incorporated in the phase error-detecting section;

FIG. 9 is a view, showing an example of a circuit employed as the circuit of the variable delay section of FIG. 2;

FIGS. 13A–13D are timing charts, useful in explaining the operation of the variable delay section;

FIGS. 14A and 14B are views, useful in explaining complementary clock signals and an internal clock signal;

FIGS. 15A and 15B are views, useful in explaining complementary clock signals and an internal clock signal;

FIGS. 16A–16C are views, useful in explaining complementary clock signals and an internal clock signal;

FIG. 17 is a view, showing another embodiment of the invention; and

FIGS. 18A–18E are views, showing signals used in the circuit of FIG. 17.

DETAILED DESCRIPTION OF THE INVENTION

Figure 3:
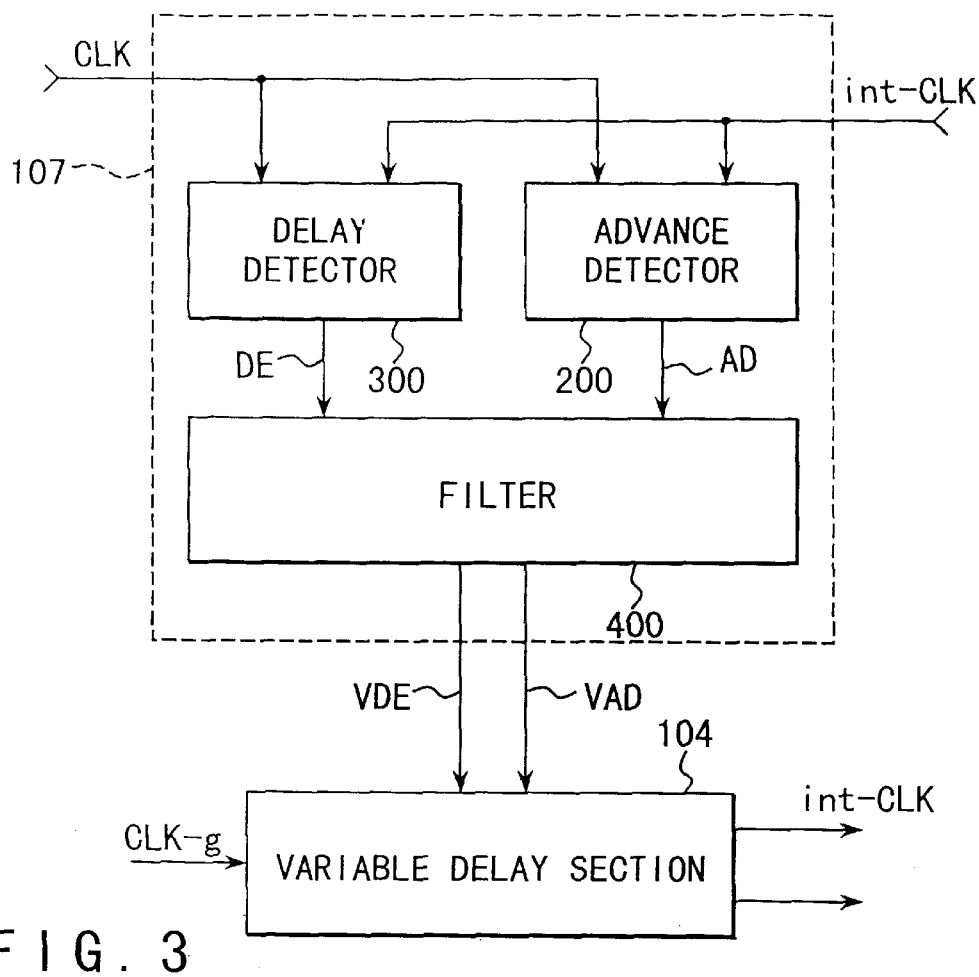
FIG. 3 is a block diagram, showing a phase error-detecting section and a variable delay section which are incorporated in the device of FIG. 2.

The embodiments of the invention will be described with reference to the accompanying drawings.

FIGS. 1A–1D are views, useful in explaining the basic idea of the invention, that show a generated clock signal CLK-g, an internal clock signal int-CLK, a reference clock signal CLK and a data signal, respectively. FIG. 2 is a schematic plan view, showing a semiconductor chip (e.g. a memory chip) 100. A memory core or logic section 110 is provided at a center portion of the memory chip 100. FIG. 2 shows elements essential to the invention in an emphasizing manner for easy understanding of the subject matter of the invention.

The generated clock signal CLK-g is a signal generated from a clock generator (not shown) and having a frequency suitable for the memory chip 100.

The reference clock CLK is used through the overall apparatus which incorporates the memory chip 100, and generated from, for example, a central processing unit or a main data processing unit. Accordingly, a data signal output from the central processing unit or the main data processing unit is synchronous with the reference clock signal CLK.

The generated clock signal CLK-g and the reference clock signal CLK are supplied to terminals 101 and 102 of the memory chip 100, respectively. The generated clock signal LCK-g is supplied to a variable delay section 104 via a first clock buffer 103, which are incorporated in the memory chip 100. The clock signal having passed the variable delay section 104 is used as the internal clock signal int-CLK.

The internal clock signal int-CLK is used, in an input/output buffer 105, for sampling or transferring data input to or output from the memory chip 100. The memory chip 100 has an input/output terminal section 106 for inputting or outputting data therethrough. Therefore, it is important to accurately synchronize the phase of the internal clock signal int-CLK with that of the data.

The variable delay section 104 for generating the internal clock signal int-CLK and the input/output buffer 105 are located close to each other. This is because it is preferable to use the internal clock signal int-CLK with its phase free from influence of wiring, etc.

The internal clock signal int-CLK having passed the input/output buffer 105 is supplied to one of the input terminals of a phase error-detecting section 107. The reference clock signal CLK is supplied to the other input terminal of the phase error-detecting section 107 via a second clock buffer 108.

The phase error-detecting section 107 detects a phase difference between the internal clock signal int-CLK and the reference clock signal CLK, thereby supplying the control terminal of the variable delay section 104 with error information indicative of the detected phase difference. As a result, the amount of delay which will occur at the time of creating the internal clock signal int-CLK from the generated clock signal CLK-g is adjusted to eliminate the phase difference between the internal clock signal int-CLK and the reference clock signal CLK.

Thus, in a destination circuit or chip, the internal clock signal int-CLK is accurately synchronized with the reference clock signal CLK from the outside. Accordingly, it is not necessary to design the overall circuit so that the time period, required for holding up or accessing a data signal, has a margin for absorbing a delay, which varies between different portions of the memory chip. In other words, the time period necessary to process input or output data may be the irreducible minimum time period necessary for the operation of the circuit using the reference clock signal CLK.

Therefore, the semiconductor memory of the invention requires no margin for the access time as compared with the conventional case, and obtains a higher operation speed than the conventional case. Moreover, the invention can deal with even a case where the synchronizing signal (i.e. the reference clock signal) has a higher cycle. In addition, even if the clock signal should be distributed to a larger number of circuits, the invention can be designed at a higher degree of freedom than the conventional device, and can perform more accurate distribution.

A further difference between the conventional internal clock signal-generating circuit and the clock processing circuit of the invention will be described.

A circuit for delaying, by substantially one cycle, a reference clock signal commonly used to control the overall system, using a variable delay unit, thereby generating an internal clock signal is cited as the conventional internal clock signal-generating circuit. In this circuit, a phase difference or phase error between a generated internal clock signal and a reference clock signal is detected by a phase comparator, to control the amount of delay of the variable delay unit. In this case, the longer the cycle of the reference clock signal, the larger the maximum delay amount of the variable delay unit must be set.

In the field of the synchronous DRAM today, it is considered to employ a reference clock signal with a frequency of 100 MHz–200 MHz. If the conventional circuit generates an internal clock signal based on this reference clock signal, the variable delay unit needs to have a delay amount of 5 ns–10 ns. In other words, it is necessary to set the maximum delay amount of the variable delay unit at about twice the minimum delay amount. If the delay amount range is set at a dynamic range as above, even the conventional circuit can have a high accuracy.

However, it has been recently requested to produce semiconductor devices operable at a high speed and applicable to a higher clock frequency of about 500 MHz. Therefore, it is possible that semiconductor devices which will be available from now on have various operation speeds. Preferably, the semiconductor devices are applicable not only to a clock signal of 500 MHz but also to a clock signal of 100 MHz. If the conventional internal clock signal-generating circuit is applied to these semiconductor devices, the delay amount range of the variable delay unit must be from 2 ns to 10 ns. This means that the maximum delay amount of the variable delay unit is about five times the minimum delay amount thereof. In this case, the area required for the variable delay unit and the power consumption thereof inevitably increase, and hence it is disadvantageous to form the variable delay unit on a semiconductor chip. Furthermore, in light of the accuracy of delay, it is difficult to give a large dynamic range to the variable delay unit.

To avoid the disadvantage and the difficulty, the invention employs a clock signal synchronization processing method free from the influence of the dynamic range. In this method, the generated clock signal CLK-g for obtaining the internal clock signal int-CLK is input to a terminal independent of a terminal for the reference clock signal CLK. The generated clock signal CLK-g which is suitable to the memory chip 100 is generated from a clock generator located close to the chip.

By virtue of the above structure, irrespective of whether the memory chip is applicable to a clock signal of 100 MHz or of 500 MHz, an internal clock signal of an appropriate phase can be easily formed in the memory chip by generating, from a clock generator, a clock signal having a phase more advancing than the reference clock signal and a frequency suitable to the chip.

Further, this type of device for individually receiving the generated clock signal and the reference clock signal is not so inconvenient to operate, since complementary clock signals can be used instead of those signals, as will be described in the next embodiment.

Since, as is shown in FIG. 2, the phase error-detecting section 107 is separated, by substantially the same distance, from both the second clock buffer 108 and the input/output buffer 105, the delay amount at each line connected to the phase error-detecting section 107, through which the internal clock signal int-CLK or the reference clock signal passes is constant. Accordingly, the phase error-detecting section 107 can accurately measure a phase difference between the internal clock signal int-CLK and the reference clock signal CLK.

Further, if a pin or a pad for supplying the reference clock signal CLK is located close to a circuit block (variable delay unit) for generating the internal clock signal int-CLK, the difference in delay amount between the lines can be ignored, and hence the phase error-detecting section 107 can be arranged with a higher degree of freedom.

If the variable delay section 104 is located close to a circuit (such as the input/output buffer) using the internal clock signal int-CLK, the internal clock signal int-CLK synchronous with the reference clock signal CLK can be used immediately.

In addition, if the internal clock signal int-CLK is supplied directly from a peripheral circuit block using the signal to the phase error-detecting section 107, the variable delay section 104 can be arranged with a higher degree of freedom.

An essential structure for realizing the above method will be described.

It is a matter of course that the invention is not limited to an embodiment below. It suffices if the above method is employed.

FIG. 3 shows the phase error-detecting section 107 and the variable delay section 104. The phase error-detecting section 107 has an advance detector 200 and a delay detector 300. Each of the advance and delay detectors 200 and 300 receives the internal clock signal int-CLK and the reference clock signal CLK. When the phase of the internal clock signal int-CLK is in advance of that of the reference clock signal CLK, the advance detector 200 generates a pulse AD with a pulse width corresponding to the degree of phase advance, whereas when the former is in retard of the latter, the delay detector 300 generates a pulse DE with a pulse width corresponding to the degree of phase delay. The pulses AD and DE output from the advance and delay detectors 200 and 300 are input to a filter 400 and integrated therein. The filter 400, in turn, supplies the variable delay section 104 with smoothed outputs VAD and VDE of the pulses AD and DE as advance control data and delay control data, respectively.

The variable delay section 104 performs the following operation:

It increases the delay amount used to generate the internal clock signal int-CLK from the generated clock signal CLK-g when the phase of the internal clock signal int-CLK is in advance of that of the reference clock signal CLK, and reduces the delay amount when the former is in retard of the latter.

As a result, the peripheral circuits operate in synchronism with the reference clock signal CLK and the internal clock signal int-CLK having the same phase as the reference clock signal CLK.

The specific circuits of the advance detector 200, the delay detector 300, the filter 400 and the variable delay section 104 will be described in this order.

Figure 4:
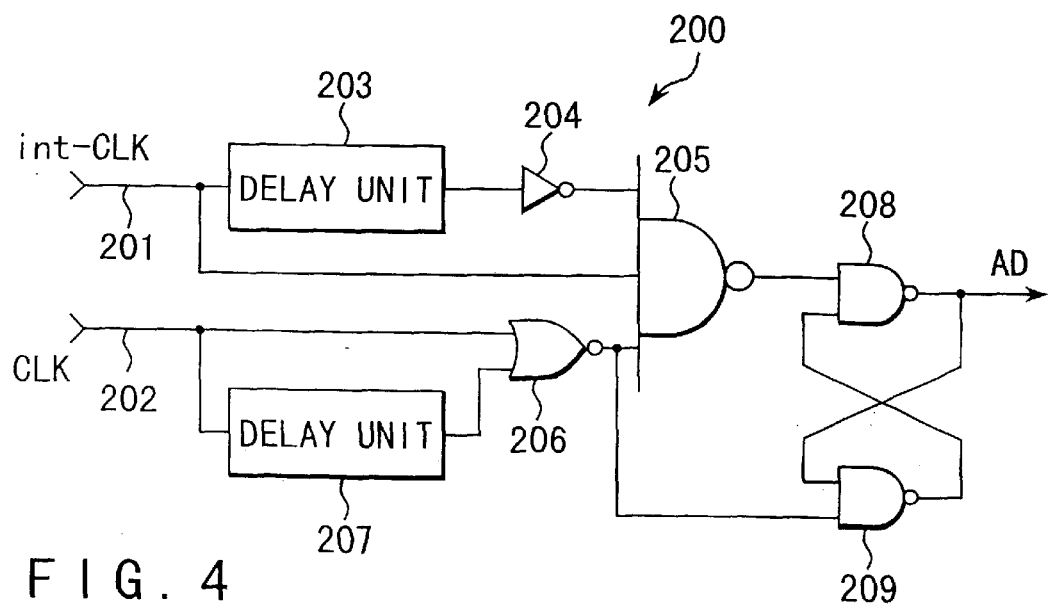
FIG. 4 is a view, showing an example of an advance-detecting circuit incorporated in the phase error-detecting section.

FIG. 4 shows the specific structure of the advance detector 200, and FIGS. 5A–5D show signal waveforms useful in explaining the operation of the advance detector 200. The advance detector 200 includes a node 201 for inputting the internal clock signal int-CLK, and a node 202 for inputting the reference clock signal CLK. The node 201 is connected to a first input node of a NAND circuit 205 via a delay unit 203 and an inverter 204, and directly connected to a second input node of the NAND circuit 205. Further, the node 202 is connected directly to a first input node of a NOR circuit 206, and to a second input node of the NOR circuit 206 via a delay unit 207. The output node of the NOR circuit 206 is connected to a third input node of the NAND circuit 205. The output node of the NAND circuit 205 is connected to a first input node of a NAND circuit 208 constituting a flip-flop, and also to a second input node of a NAND circuit 209 constituting a flip-flop. The output node of the NAND circuit 209 is connected to a second input node of the NAND circuit 208, and the output node of the NAND circuit 208 is connected to a first input node of the NAND circuit 209.

When the phase of the internal clock signal int-CLK is in advance of that of the reference clock signal CLK, the advance detector outputs operation waves as shown in FIGS. 5A–5D, and the output node of the NAND circuit 208 outputs a pulse AD with a pulse width corresponding to a phase error. Thus, the advance detector 200 generates a pulse AD which will rise with the rise of the internal clock signal int-CLK and fall with the rise of the reference clock signal CLK. When the internal clock signal int-CLK is input in retard of the reference clock signal CLK, the advance detector 200 ignores the internal clock signal and outputs no pulse AD.

FIG. 6 shows the delay detector 300. This detector 300 has the same circuit as the advance detector 200. The elements denoted by reference numerals 301–309 correspond to the elements with reference numerals 201–209, respectively. FIGS. 7A–7D show signal waveforms useful in explaining the operation of the delay detector 300. In the detector 300, the internal clock signal int-CLK and the reference clock signal CLK are input to the nodes 302 and 301, respectively, in an opposite manner to the case of the advance detector 200. The delay detector 300 generates a pulse DE which will rise with the rise of the reference clock signal CLK and fall with the rise of the internal clock signal int-CLK. When the reference clock signal CLK is input in retard of the internal clock signal int-CLK, the delay detector 300 ignores the reference clock signal and outputs no pulse DE.

Each delay unit incorporated in the advance detector 200 and the delay detector 300 is constituted of, for example, an even number of inverters connected in series. Since the delay amount of the delay unit is set larger than the delay amount between the internal clock signal int-CLK and the reference clock signal CLK, the above-described operations are performed accurately.

FIG. 8 shows the specific structure of the filter 400.

The pulse AD is supplied from the advance detector 200 to an input node 401, which is connected to the gate electrode of a P-channel MOS transistor 403 via an inverter 402. The input node 401 is also connected to the gate electrode of an N-channel MOS transistor 414.

The drain of the P-channel MOS transistor 403 is connected to a power supply, and the source thereof is connected to the drain of an N-channel MOS transistor 404. The source of the N-channel MOS transistor 404 is grounded. A resistor 405 has an end thereof connected to the junction of the source of the P-channel MOS transistor 403 and the drain of the N-channel MOS transistor 404, and the other end grounded via a capacitor 406 and also connected to an output node 407.

On the other hand, the pulse DE is supplied from the delay detector 300 to an input node 411, which is connected to the gate electrode of a P-channel MOS transistor 413 via an inverter 412 and also to the gate electrode of the N-channel MOS transistor 404.

The drain of the P-channel MOS transistor 413 is connected to the power supply, and the source thereof is connected to the drain of the N-channel MOS transistor 414. The source of the N-channel MOS transistor 414 is grounded. A resistor 415 has an end thereof connected to the junction of the source of the P-channel MOS transistor 413 and the drain of the N-channel MOS transistor 414, and the other end grounded via a capacitor 416 and connected to an output node 417.

In the above-described circuit, a voltage VAD proportional to the pulse width of the pulse AD appears at the output node 407, while a voltage VDE proportional to the pulse width of the pulse DE appears at the output node 417.

In FIG. 8, a circuit 40 generates information as to how much the phase of the internal clock signal advances, and a circuit 41 generates information as to how much the phase of the internal clock signal delays.

Since the circuits 40 and 41 have the same structure, the operation of only the circuit 40 will be described. When the pulse AD is set at a high level "H", the P-channel MOS transistor 403 is in the ON-state, and the capacitor 406 is charged. On the other hand, when the pulse AD is set at a low level "L", the P-channel MOS transistor 403 is in the OFF-state, and the capacitor 406 has its potential kept. When the pulse DE is shifted to a high level "H", the N-channel MOS transistor 404 is turned on and the capacity is discharged.

Thus, while the pulse AD is kept at the high level "H", the voltage VAD corresponding to the pulse width of the pulse AD appears at the output node 407. When the pulse DE is shifted to the high level "H", the voltage VAD is shifted to a low level "L".

As a result, in the circuit 40, it is rarely the case that the phase of the internal clock signal int-CLK is alternately in advance of and in retard of the phase of the reference clock signal CLK. Such a rare case, if occurs, can be accurately dealt with by the circuit 40.

In a manner similar to the above, the circuit 41 for generating information as to how much the phase of the internal clock signal delays can obtain, at the output node 417, the voltage VDE proportional to the pulse width of the pulse DE. Further, When the pulse AD is shifted to the high level "H", the voltage VDE is shifted to the low level "L". As a result, even if there is a case where the phase of the internal clock signal int-CLK is alternately in advance of and in retard of the phase of the reference clock signal CLK, the circuit 41 can accurately deal with the case.

Thus, the voltage VAD corresponding to the pulse width of the pulse AD is output to the output node 407, while the voltage VDE corresponding to the pulse width of the pulse DE is output to the output node 417.

The time constant of a CR circuit constituted of a capacitor and a resistor is selected so that the voltage VAD (or VDE) proportional to the time period for which the pulse AD (or DE) is kept at "H" can be generated accurately. Strictly speaking, the voltage VAD (or VDE) is obtained by integrating the power supply voltage for a time period corresponding to the pulse AD (or DE).

Referring then to FIG. 9, a specific structure of the variable delay section 104 will now be described, which delays the generated clock signal CLK-g, generates the internal clock signal int-CLK, and causes the internal clock signal int-CLK and the reference clock signal CLK to have the same phase.

As is shown in FIG. 9, the variably delay section 104 consists of a type 1 and a type 2. Generated clock signals of anti-phases are input to the types 1 and 2, respectively.

The type 1 will be described first. An input node 501 is connected to the drain of a P-channel MOS transistor 504 via inverters 502 and 503. The voltage VAD is applied to the gate electrode of the P-channel MOS transistor 504, and the source of the transistor 504 is connected to an output node 509 and also to the drain of the P-channel MOS transistor 505. The voltage VDE is applied to the gate electrode of the P-channel MOS transistor 505, and the source of the transistor 505 is grounded via a capacitor 506 and connected to the drain of an N-channel MOS transistor 507. The source of the N-channel MOS transistor 507 is grounded. The source of the P-channel MOS transistor 504 is connected to the drain of an N-channel MOS transistor 508 having its source grounded. The gate electrodes of the transistors 507 and 508 are connected to an output node 529 incorporated in the type 2.

The type 2 will be described. An input node 521 is connected to the drain of a P-channel MOS transistor 524 via inverters 522 and 523. The voltage VAD is applied to the gate electrode of the P-channel MOS transistor 524, and the source of the transistor 524 is connected to an output node 529 and also to the drain of the P-channel MOS transistor 525. The voltage VDE is applied to the gate electrode of the P-channel MOS transistor 525, and the source of the transistor 525 is grounded via a capacitor 526 and connected to the drain of an N-channel MOS transistor 527. The source of the N-channel MOS transistor 527 is grounded. The source of the P-channel MOS transistor 524 is connected to the drain of an N-channel MOS transistor 528 having its source grounded. The gate electrodes of the transistors 527 and 528 are connected to the input node 501 incorporated in the type 1.

The MOS transistors 504 and 524 function as variable resistors having their resistances varied by the voltage VAD. The higher the voltage VAD, the longer the time period required for the output nodes 509 and 529 to reach a predetermined level. In other words, the greater the phase of the internal clock signal int-CLK advances relative to that of the reference clock signal CLK, the greater a level change in the output node 509 or 529 delays.

The MOS transistors 505 and 525 function as variable resistors having their resistances varied by the voltage VDE. The higher the voltage VDE, the shorter the time period required for the output nodes 509 and 529 to reach the predetermined level. In other words, the greater the phase of the internal clock signal int-CLK delays relative to that of the reference clock signal CLK, the greater a level change in the output node 509 or 529 advances.

In the type 1, in response to a signal from the output node 529, the MOS transistor 508 sets the output node 509 at a low level, and the MOS transistor 507 sets the node of the capacitor 506 at a low level. Similarly, in the type 2, in response to a signal from the input node 501, the MOS transistor 528 sets the output node 529 at a low level, and the MOS transistor 527 sets the node of the capacitor 526 at a low level.

These resetting functions are provided for reliably initializing the variable delay section before the next clock signal is input to the input node 501 or 521. The reliable initialization enables the delay amount between the reference clock signal CLK and the internal clock signal int-CLK to be accurately encoded.

The conditions under which the above-described circuit should be used will be referred to.

Figure 10:
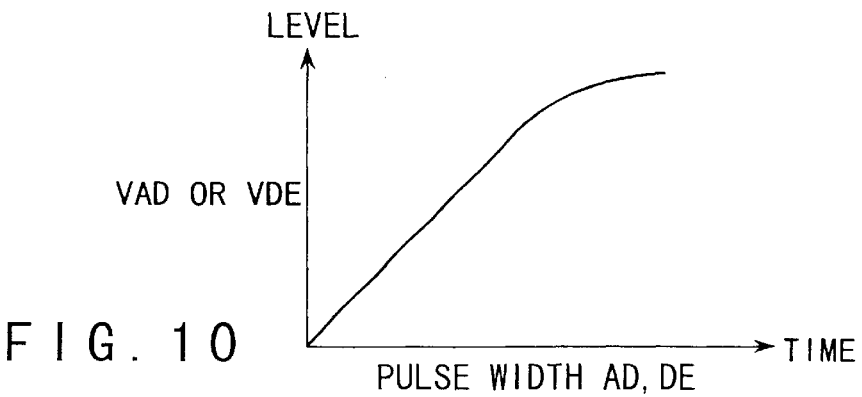
FIG. 10 is a graph, showing the operating characteristics of the filter of FIG. 8.

FIG. 10 is a graph, showing the relationship between the pulse width of the pulse AD or DE and a change in the voltage VAD or VDE in the filter 400.

Figure 11:
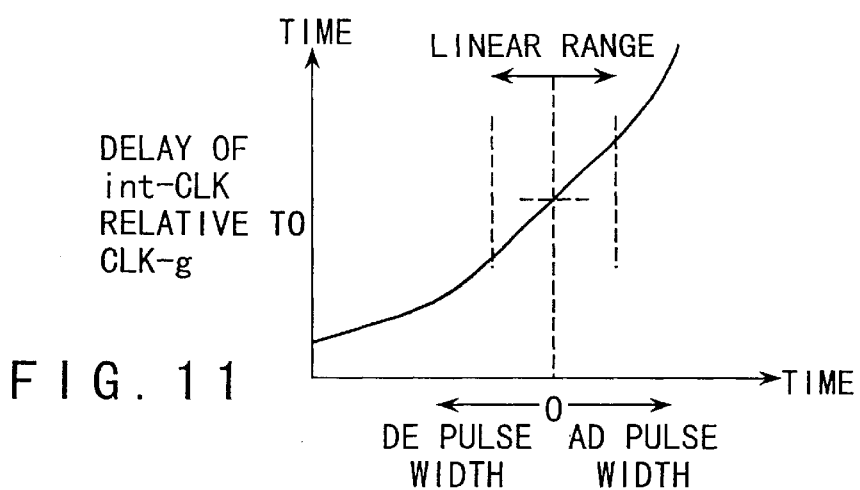
FIG. 11 is a graph, showing the operating characteristics of the circuit of FIG. 3.

FIG. 11 is a graph, showing the relationship between the pulse width of the pulse AD or DE and a delay in the phase of the internal clock signal int-CLK relative to the phase of the generated clock signal CLK-g. This figure shows the characteristics of the FIG. 3 circuit.

As is shown in FIG. 10, the voltage VAD or VDE varies substantially proportional to the pulse width when the pulse width is small, and enters a saturation voltage area when the pulse width becomes larger. The critical value at which the voltage enters the saturation area, and the inclination of the voltage (i.e. the rate of change therein) depend upon the absolute value of the voltage VAD or VDE.

Further, as is shown in FIG. 11, the greater the pulse width of the pulse DE, the smaller the delay in the phase of the internal clock signal int-CLK relative to that of the generated clock signal CLK-g and the greater the delay approaches a minimum value. This is because when the pulse width of the pulse DE is largest, the voltages VDE and VAD are considered substantially identical to the power supply potential and the ground potential, respectively, the capacitor 506 is in the OFF-state, the P-channel MOS transistors 504 and 524 are in the completely ON-state, and the delay amount at the nodes 509 and 529 is minimized.

On the other hand, the larger the pulse width of the pulse AD, the closer the voltages VAD and VDE approach the power supply potential and the ground potential, respectively. When the pulse width of the pulse AD is largest, the voltages VAD and VDE are considered substantially identical to the power supply potential and the ground potential, respectively, the P-channel MOS transistors 504 and 524 are in the OFF-state, the input nodes 501 and 521 are disconnected from the output nodes 509 and 529, respectively, and the delay becomes infinite.

In FIG. 11, a predetermined range (X range) with a pulse width of 0 as its center has a linear characteristic, and the other ranges have a non-linear characteristic. To accurately control the delay of the internal clock signal int-CLK, it is prefer to be used the delay data on the linear range shown in FIG. 11.

Therefore, the variable delay section 104 uses the linear range as its control region. If the control region is wide, i.e. if the delay amount between the generated clock signal CLK-g and the internal clock signal int-CLK is large, a plurality of variable delay sections as described above are used. As a result, accurate phase adjustment can be performed irrespective of the delay amount therebetween.

An embodiment which employs a plurality of variable delay sections will be described.

Figure 12A:
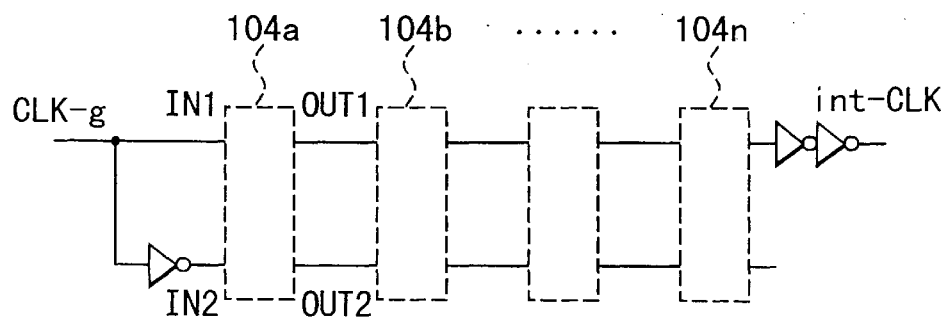
FIGS. 12A and 12B are views, showing other examples of the variable delay section.
Figure 12B:
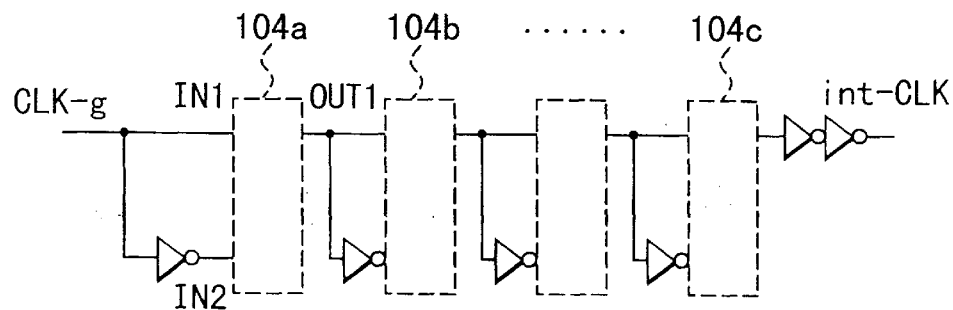

FIGS. 12A and 12B each show a variable delay unit which comprises the aforementioned variable delay sections connected in series.

FIG. 12A shows a method for sequentially connecting a plurality of variable delay sections 104a, 104b, 104c, . . . , which are similar to the variable delay section 104 shown in FIG. 9. In this method, the generated clock signal CLK-g is directly input to the type-1-side input node of the first variable delay section 104a, and a clock signal obtained by inverting the generated clock signal CLK-G is input to the type-2-side input node of the section 104a. An internal clock signal int-CLK which is in retard of the generated clock signal CLK-g by a predetermined delay amount is obtained by shaping the waveform of an output from the output node of the last variable delay section 104n.

In the case of FIG. 12B, the generated clock signal CLK-g is input to the type-1-side input node of the first variable delay section 104a, which is similar to the variable delay section 104 shown in FIG. 9, and a clock signal obtained by inverting the generated clock signal CLK-g is input to the type-2-side input node of the section 104a. The output of the section 104a is taken from the type-1-side output node thereof, and then input to the type-1-side input node of the next variably delay section 104b. A clock signal obtained by inverting the output taken from the type-1-side output node of the first delay section 104a is input to the type-2-side input node of the delay section 104b. The output of the delay section 104b is taken from the type-1-side output node thereof. The other variable delay sections 104c, . . . , 104n are connected to each other in the same manner as the above. An internal clock signal int-CLK which is in retard of the generated clock signal CLK-g by a predetermined delay amount is obtained by shaping the waveform of an output from the type-1-side output node of the last variable delay section 104n.

The invention is not limited to the above-described connection methods, but can employ other methods in accordance with changes in circuit design.

Outputs obtained from the above circuits will be described.

FIGS. 13A–13D show the phases of the pulse AD and the delay amount control voltage VAD which are generated when the internal clock signal int-CLK is in advance of the reference clock signal CLK, and the phase of that internal clock signal int-CLK which is obtained by feeding back a delay amount to the first-mentioned internal clock signal.

As is shown in FIGS. 13A–13D, the pulse AD is obtained when a first internal clock signal int-CLK is in advance of the reference clock signal CLK, and the capacitor in the CR circuit is charged to gradually increase the voltage VAD while the pulse AD is kept at "H". Since the variable delay section 104 increases the amount of delay in proportion to the voltage VAD, the rise of a second internal clock signal int-CLK is delayed. This adjustment is repeated to cause the phase of a rising portion of the internal clock signal int-CLK to coincide with that of a rising portion of the reference clock signal CLK.

Since, however, the capacitor potential of the CR circuit is spontaneously discharged and hence the voltage VAD gradually decreases, the phase of the internal clock signal gradually advances relative to that of the reference clock signal. Accordingly, the pulse AD is again output to delay the phase of the internal clock signal int-CLK. Thus, the internal clock signal int-CLK is monitored so that the phase of a rising portion thereof can be identical at all times to that of the reference clock signal CLK.

When, on the other hand, the phase of the internal clock signal int-CLK is in retard of that of the reference CLK, the pulse DE is output in place of the pulse AD, thereby providing the voltage VDE. Also in this case, similar feedback control to the above is performed, with the result that the phase of a rising portion of the internal clock signal int-CLK coincides with that of the reference clock signal CLK.

The phase error-detecting section 107 is not limited to the above-described structure if it can detect the phase difference between the internal clock signal int-CLK and the reference clock signal CLK. Moreover, the variable delay section 104 is not limited to the aforementioned structure if it can perform timing adjustment to eliminate the phase difference at the time of generating the internal clock signal int-CLK from the generated clock signal CLK-g.

A modification in which the reference clock signal is not of a single-phase rectangular waveform will be described.

In this case, complementary clock signals are used as the reference clock signal. More specifically, the difference between the complementary clock signals is calculated, and the internal clock signal is generated when the difference is 0.

FIGS. 14A, 14B, 15A and 15B are views, useful in explaining the manner of using the difference between complementary clock signals to trigger the generation of the internal clock signal int-CLK. FIG. 14A shows a case where no phase difference exists between the complementary clock signals, and FIG. 15A shows a case where a phase difference exists therebetween. As is understood from these figures, even if a phase difference exists between the complementary clock signals, the cycle of the internal clock signal int-CLK is kept constant.

FIGS. 16A–16C show the relationship between the complementary clock signals CLK and /CLK and the internal clock signal int-CLK.

Suppose a semiconductor device in which a signal is received or transmitted in synchronism with each edge portion of the complementary clock signals CLK and /CLK. If a rising portion of the internal clock signal int-CLK does not accurately coincide with each edge portion of the complementary clock signals CLK and /CLK, the time period, required for holding up or accessing a data signal, must have a margin for absorbing the phase difference, which makes it hard to perform a high speed operation. Even if the frequency of the internal clock signal is increased to a value twice the external clock signal, using complementary clock signals, a high speed operation cannot be realized since a margin is required for absorbing a delay in the internal clock signal or a phase difference between the internal clock signal and the reference clock signal.

The invention can be applied to make the phase of a rising portion of the internal clock signal to accurately coincide with a predetermined phase of the complementary clock signals.

FIG. 17 shows yet another embodiment of the invention wherein a complex internal clock signal CLK consisting of internal clock signals int-CLK1 and int-CLK2 is created using complementary clock signals. The circuit employed in this embodiment can make the phase of the complex internal clock signal to accurately coincide with the phase of the combination of the complementary clock signals CLK and /CLK (the clock signal /CLK is obtained by inverting the clock signal CLK).

In FIG. 17, reference numeral 710 denotes a first delay control section, and reference numeral 720 a second delay control section. The first delay control section 710 has a phase error-detecting section 711 similar to the phase error-detecting section 107, and a variable delay section 712 similar to the variable delay section 104. The variable delay section 712 delays the complementary clock signal /CLK in response to a control signal from the phase error-detecting section 711, thereby creating the first internal clock signal int-CLK1. In other words, the complementary clock signal /CLK corresponds to the generated clock signal CLK-g, while the complementary clock signal CLK corresponds to the reference clock signal.

Where the above control system is employed, the phase of a rising portion of the first internal clock signal int-CLK1 is made to always coincide with that of the complementary clock signal CLK even if there occurs a phase difference between the complementary clock signals CLK and /CLK. Accordingly, where data transferred from the outside of the circuit is synchronous with the complementary clock signal CLK, it can be accurately extracted using the first internal clock signal int-CLK1.

The second delay control section 720 can perform a similar operation to the first delay control section 710. The second delay control section 720 has a phase error-detecting section 721 and a variable delay section 722. In this case, the complementary clock signal CLK corresponds to the generated clock signal CLK-g, while the complementary clock signal /CLK corresponds to the reference clock signal. Accordingly, the phase of a rising portion of the second internal clock signal int-CLK2 is made to always coincide with that of the complementary clock signal /CLK.

Alternatively, it may be modified such that the first and second internal clock signals are supplied to an OR circuit 730 to create a complex internal clock signal int-CLK with a frequency twice the frequency of the first or second internal clock signal.

FIGS. 18A–18E show the above-described complementary clock signals, the complex internal clock signal, and the first and second internal clock signals.

Since this circuit can generate internal clock signals synchronous with the complementary clock signals, no margin is necessary for the time period required to hold up or access data, etc., and therefore the circuit can operate at a high speed.

The invention is also applicable to a circuit, other than the synchronous DRAM, which operates in synchronism with a clock signal distributed thereto. As a result, the circuit can adjust the time point at which the internal clock signal rises, and accurately process input/output data.

Furthermore, the invention can take in two or more signals from different circuits, thereby controlling at least one of the signals on the basis of time differences therebetween. The invention can also be used to control a signal quite different from those signals.

The invention is also applicable to a case where two or more signals are detected and a phase difference therebetween is detected on the basis of a difference in amplitude therebetween by means of devices differing from the phase error-detecting section and the variable delay section employed in the embodiments, thereby controlling at least one of the signals. The invention is further applicable to a case where two or more signals are detected and a phase difference therebetween is detected on the basis of a difference in amplitude therebetween, thereby controlling a signal quite different from those signals.

In addition, although the invention employs only a single phase adjusting system for the external clock signal, it is a matter of course that the circuits to which the internal clock signal is distributed can have their respective phase adjusting systems. In this case, an optimal internal clock signal for each circuit, which is synchronous with the reference clock signal, can be obtained.

As described above, the circuit of the invention for use in a semiconductor chip includes a first clock signal input section for taking in a reference clock signal, and a second clock signal input section for taking in a generated clock signal used to create an internal clock signal. Since the internal clock signal can be made to coincide with the reference clock signal in each of different circuits to which the internal clock signal is distributed, no extra margin of time is necessary to operate the circuit in synchronism with these signals, resulting in an increase in the operation speed of the circuit.

What is claimed is:

1. A clock synchronizing circuit comprising:
   a variable delay section for delaying a an input clock signal to create an internal clock signal;
   a detecting section for detecting a time difference between a predetermined phase of the internal clock signal and a predetermined phase of a reference clock signal the reference clock signal being used to synchronize the phase of the internal clock signal with the phase of the reference clock signal and the reference clock signal being a different clock signal from the input clock signal; and
   a first controller which controls a delay amount of the variable delay section to substantially eliminate the time difference, thereby substantially synchronizing the predetermined phase of the internal clock signal with the predetermined phase of the reference clock signal.

2. The clock synchronizing circuit according to claim 1, wherein the detecting section includes:
   a pulse generating circuit for generating a pulse with a width indicative of the time difference; and
   a filter circuit for generating an output substantially proportional to a change in the width of the pulse.

3. The clock synchronizing circuit according to claim 1, wherein the detecting section includes;

an advance detecting unit for generating, where the internal clock signal is in advance of the reference clock signal, a first pulse which substantially simultaneously rises when the internal clock signal rises, and substantially simultaneously falls when the reference clock signal rises; and a delay detecting unit for generating, where the internal clock signal is in retard of the reference clock signal, a first pulse which substantially simultaneously rises when the reference clock signal rises, and substantially simultaneously falls when the internal clock signal rises.

4. The clock synchronizing circuit according to claim 3, wherein the detecting section further includes:

a charge/discharge circuit constituted of first and second capacitors and resistors;

an advance control potential output unit for charging the first capacitor and outputting a potential determined from the first capacitor, when the first pulse rises; and a delay control potential output unit for charging the second capacitor and outputting a potential determined from the second capacitor, when the second pulse rises.

5. The clock synchronizing circuit according to claim 4, wherein the variable delay section is constituted of a plurality of variable delay units connected in series and receiving, as inputs, outputs from the advance control potential output unit and the delay control potential output unit, and has a delay amount thereof set substantially proportional to the inputs, a first-stage one of the variable delay units receiving the generated clock signal, a last-stage one of the variable delay units outputting the internal clock signal.

6. The clock synchronizing circuit according to claim 1, wherein the detecting section is separated by substantially the same distance from a buffer for generating the reference clock signal and from a circuit for using the internal clock signal.

7. The clock synchronizing circuit according to claim 1, wherein the generated clock signal and the reference clock signal forms a pair of complementary clock signals.

8. The clock synchronizing circuit according to 1, wherein the variable delay section, the detecting section and the first controller constitute a first delay control device and further comprising second variable delay section, a second detecting section and second controller which constitute a second delay control device, the first delay control device using one of the pair of complementary clock signals as the generated clock signal, and the other of the complementary clock signals as the reference clock signal, the second delay control device using said one of the pair of complementary clock signals as the reference clock signal, and said the other of the complementary clock signals as the generated clock signal.

9. A clock processing method of signalizing a time difference between an internal clock signal based on an input clock signal and a reference clock signal different from the input clock signal, and feeding a resultant signal back to a section which has generated the internal clock signal, to thereby control when the internal clock signal is generated.

10. A semiconductor device comprising:

a clock processing circuit having a detecting section for detecting a time difference between a predetermined phase of an internal clock signal and a predetermined phase of a reference clock signal, and delay means for adjusting when the internal clock signal is generated from the generated clock signal to substantially eliminate the time difference, thereby substantially synchronizing a predetermined phase of the internal clock signal with a predetermined phase of the reference clock signal; and a logic circuit section for inputting/outputting a signal in synchronism with the internal clock signal and the reference clock signal.

11. The semiconductor device according to claim 10, wherein the detecting section is located in a position in which the distance of transfer of the reference clock signal from a buffer to the detecting section is substantially identical to the distance of transfer of the internal clock signal from a circuit using the internal clock signal to the detecting section.

12. The semiconductor device according to claim 10, wherein the logic circuit section includes a memory cell array or a logic circuit.

13. The semiconductor device according to claim 12, wherein the generated clock signal and the reference clock signal are input via different terminals.

14. The semiconductor device according to claim 12, wherein the generated clock signal is generated from a clock generator located close to a semiconductor chip.

15. The semiconductor device according to claim 12, wherein the internal clock signal obtained by delaying the generated clock signal has a frequency falling substantially selected from the range of 100 MHZ–500 MHZ.

* * * * *